(12) United States Patent
Ji

(10) Patent No.: US 9,520,495 B2
(45) Date of Patent: Dec. 13, 2016

(54) TRANSISTOR INCLUDING A STRESSED CHANNEL, A METHOD FOR FABRICATING THE SAME, AND AN ELECTRONIC DEVICE INCLUDING THE SAME

(71) Applicant: SK hynix Inc., Icheon (KR)

(72) Inventor: Yun-Hyuck Ji, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/863,362

(22) Filed: Sep. 23, 2015

(65) Prior Publication Data

US 2016/0013315 A1    Jan. 14, 2016

Related U.S. Application Data

(62) Division of application No. 14/216,538, filed on Mar. 17, 2014, now Pat. No. 9,171,905.

(30) Foreign Application Priority Data

Nov. 11, 2013  (KR) .................. 10-2013-0136392

(51) Int. Cl.
| | | |
|---|---|---|
| H01L 21/8238 | (2006.01) | |
| H01L 27/092 | (2006.01) | |
| H01L 29/78 | (2006.01) | |
| H01L 21/8234 | (2006.01) | |
| H01L 29/10 | (2006.01) | |
| H01L 21/324 | (2006.01) | |
| H01L 29/49 | (2006.01) | |
| H01L 29/66 | (2006.01) | |

(52) U.S. Cl.
CPC ......... *H01L 29/7845* (2013.01); *H01L 21/324* (2013.01); *H01L 21/823418* (2013.01); *H01L 21/823437* (2013.01); *H01L 21/823807* (2013.01); *H01L 21/823828* (2013.01); *H01L 21/823842* (2013.01); *H01L 27/092* (2013.01); *H01L 29/1033* (2013.01); *H01L 29/1054* (2013.01); *H01L 29/4916* (2013.01); *H01L 29/4933* (2013.01); *H01L 29/66515* (2013.01); *H01L 29/66575* (2013.01); *H01L 29/78* (2013.01)

(58) Field of Classification Search
CPC ............. H01L 29/1054; H01L 29/1033; H01L 21/823828; H01L 21/823437; H01L 21/82345; H01L 27/092; H01L 27/0922; H01L 29/4916; H01L 29/4925; H01L 21/823835; H01L 21/823842
See application file for complete search history.

(56) References Cited

U.S. PATENT DOCUMENTS

| 6,596,605 B2 | 7/2003 | Ha et al. | |
|---|---|---|---|
| 7,348,636 B2 * | 3/2008 | Ryu | ............... H01L 27/092 257/369 |

(Continued)

FOREIGN PATENT DOCUMENTS

| KR | 10-2006-0104398 A | 10/2006 |
|---|---|---|
| KR | 10-2011-0036312 A | 4/2011 |

*Primary Examiner* — Jose R Diaz

(57) ABSTRACT

A semiconductor device includes a first channel, a second channel, a first strained gate electrode including a first lattice-mismatched layer for applying a first stress to the first channel, and a second strained gate electrode including a second lattice-mismatched layer for applying a second stress to the second channel.

7 Claims, 16 Drawing Sheets

(56) References Cited

U.S. PATENT DOCUMENTS

| | | |
|---|---|---|
| 8,421,130 B2 | 4/2013 | Liaw et al. |
| 2001/0015922 A1 | 8/2001 | Ponomarev |
| 2010/0078729 A1* | 4/2010 | Fukutome ......... H01L 21/28035 |
| | | 257/369 |

* cited by examiner

TRANSISTOR INCLUDING A STRESSED CHANNEL, A METHOD FOR FABRICATING THE SAME, AND AN ELECTRONIC DEVICE INCLUDING THE SAME

CROSS-REFERENCE TO RELATED APPLICATIONS

The present application is a divisional of U.S. patent application Ser. No. 14/216,538 filed on Mar. 17, 2014, which claims priority to Korean Patent Application No. 10-2013-0136392, filed on Nov. 11, 2013, which is incorporated herein by reference in its entirety.

BACKGROUND

1. Field

Embodiments of the present invention relate to a transistor including a stressed channel, a method for fabricating the same, and an electronic device including the same.

2. Description of the Related Art

An electronic device is realized using a plurality of transistors. As transistors are scaled down, ways of improving the performance of transistors become increasingly important. For example, one way of improving transistor performance is to increase a driving current so that the transistor can perform high-speed operations.

SUMMARY

Embodiments of the present disclosure are directed to a transistor including a stressed channel, a method for fabricating the same, and an electronic device including the same.

In an embodiment, a semiconductor device may include: a substrate including a first channel and a second channel; a first strained gate electrode including a first lattice-mismatched layer for applying a first stress to the first channel and a second strained gate electrode including a second lattice mismatch layer for applying a second stress to the second channel. The first lattice mismatch layer may include a first crystalline silicon layer doped with a first element which has an atomic radius larger than silicon, and a second crystalline silicon layer that is not doped with the first element and that is disposed over the first crystalline silicon layer; and lattice mismatch may occur due to a difference between atomic radius of silicon and the first element. The second lattice mismatch layer may include a first crystalline silicon layer doped with a first element which has an atomic radius smaller than silicon, and a second crystalline silicon layer formed over the first crystalline silicon layer and doped with a second element which has an atomic radius larger than silicon; and lattice mismatch may occur due to a difference between the atomic radius of the first element and the second element.

In an embodiment, a CMOSFET may include: an N-type MOSFET including a tensile strained gate electrode and a first channel, the tensile strained gate electrode including a first lattice-mismatched crystalline silicon layer applying a tensile stress to the first channel; and a P-type MOSFET including a compressive strained gate electrode and a second channel, the compressive strained gate electrode including a second lattice-mismatched crystalline silicon layer applying a compressive stress to the second channel.

In an embodiment, a method for fabricating a semiconductor device may include: preparing a substrate which includes a first transistor region and a second transistor region; forming a first strained gate electrode which includes a first lattice-mismatched crystalline silicon layer disposed over the first transistor region; and forming a second strained gate electrode which includes a second lattice-mismatched crystalline silicon layer disposed over the second transistor region. The forming of the first strained gate electrode may include forming a gate dielectric layer over the substrate; forming an amorphous silicon layer over the gate dielectric layer; doping arsenic into a lower portion of the amorphous silicon layer to form a stacked structure of a doped amorphous silicon layer and an undoped amorphous silicon layer; and performing an annealing process on the stacked structure to convert the stacked structure into the first lattice-mismatched crystalline silicon layer. The forming of the second strained gate electrode may include forming a gate dielectric layer over the substrate; forming an amorphous silicon layer over the gate dielectric layer; doping boron into a lower portion of the amorphous silicon layer to form a first doped amorphous silicon layer; doping germanium into a upper portion of the amorphous silicon layer to form a second doped amorphous silicon layer over the first doped amorphous silicon layer; and performing an annealing process on the first and second amorphous silicon layers to convert the first doped amorphous silicon layer and the second doped amorphous silicon layer into the second lattice-mismatched crystalline silicon layer.

According to an embodiment, since a stressed channel is formed by a strained gate electrode which includes a lattice-mismatched layer, it is possible to increase a driving current and improve the performance of a scaled down transistor.

Accordingly, an electronic device including a plurality of transistors in which performance is improved by stressed channels may perform high-speed operations even if the transistors are scaled down.

DETAILED DESCRIPTION

Figure 1A:
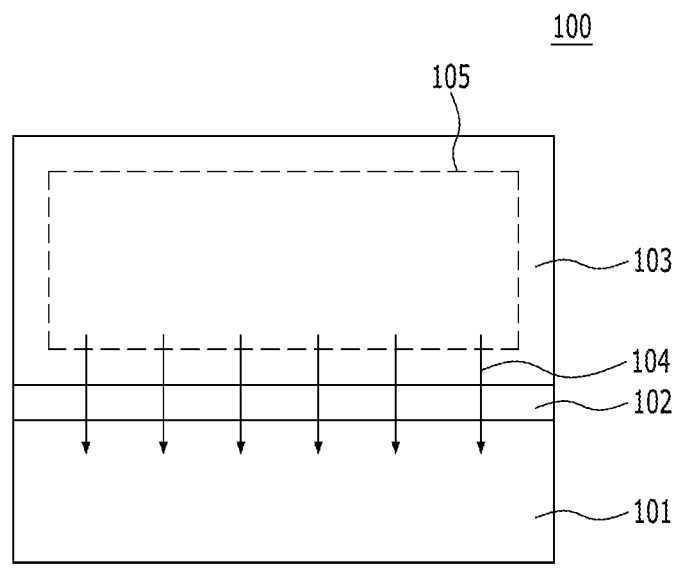
FIG. 1A is a view illustrating a semiconductor structure which is stress-engineered in accordance with an embodiment.

Embodiments of the present disclosure will be described below in more detail with reference to the accompanying drawings.

The drawings may not be necessarily to scale and in some instances, proportions of at least some structures in the drawings may be exaggerated in order to clearly illustrate features of embodiments. In presenting an embodiment in a drawing or description having two or more layers in a multi-layer structure, the relative positioning relationship of such layers or the sequence of arranging the layers as shown reflects a particular implementation of an embodiment and a different relative positioning relationship or sequence of arranging the layers may be possible. In addition, an embodiment of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1A is a view illustrating a semiconductor structure 100 which is stress-engineered in accordance with an embodiment.

The semiconductor structure 100 includes a stressed layer 101 and a strained layer 103. An intermediate layer 102 may be formed between the stressed layer 101 and the strained layer 103.

The stressed layer 101 is a layer to which a stress 104 is applied.

The strained layer 103 is a layer in which a strain 105 is generated. The stress 104 is applied to the stressed layer 101 by the strain 105. The strain 105 is generated in the strained layer 103 by a lattice mismatch. The strained layer 103 includes a strain generating element by which the lattice mismatch occurs, and the strain 105 is generated by the lattice mismatch.

The stressed layer 101 and the strained layer 103 may include a silicon-containing material. The stressed layer 101 and the strained layer 103 may include silicon layers. The strained layer 103 may include a lattice-mismatched silicon layer. The strained layer 103 may include a lattice-mismatched crystalline silicon layer.

The stress 104 applied to the stressed layer 101 may include a tensile stress or a compressive stress. Whether a tensile stress or a compressive stress is applied depends on the kind of strain 105 which is generated in the strained layer 103. For example, a tensile stress is applied by a tensile strain, and a compressive stress is applied by a compressive strain.

Figure 1B:
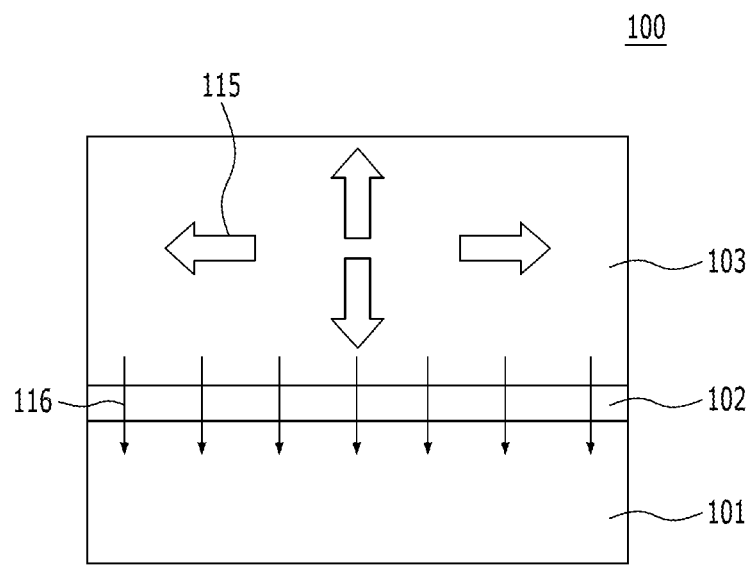
FIG. 1B is a view illustrating a semiconductor structure including a stressed layer to which a tensile stress is applied.

FIG. 1B is a view illustrating a semiconductor structure including a stressed layer to which a tensile stress is applied.

Referring to FIG. 1B, a tensile strain 115 is generated in a strained layer 103, and thus a tensile stress 116 is applied to a stressed layer 101 by the tensile strain 115.

Figure 1C:
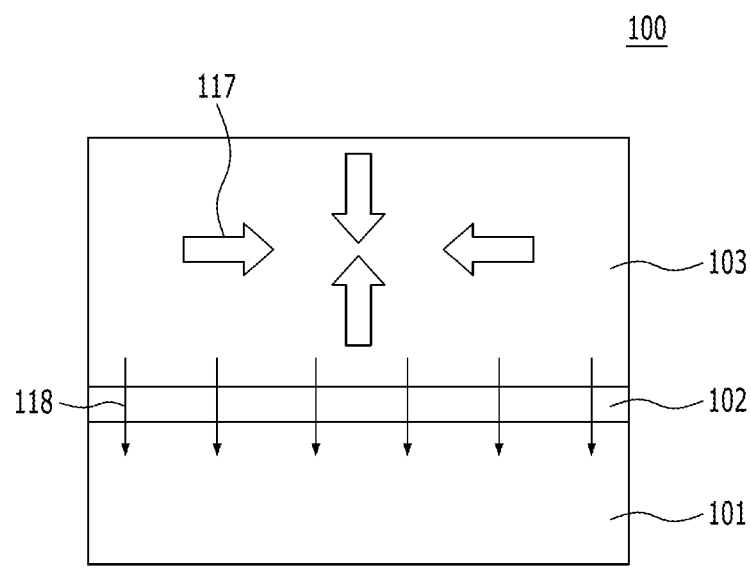
FIG. 1C is a view illustrating a semiconductor structure including a stressed layer to which a compressive stress is applied.

FIG. 1C is a view illustrating a semiconductor structure including a stressed layer to which a compressive stress is applied.

Referring to FIG. 1C, a compressive strain 117 is generated in a strained layer 103, and thus a compressive stress 118 is applied to a stressed layer 101 by the compressive strain 117.

Figure 2A:
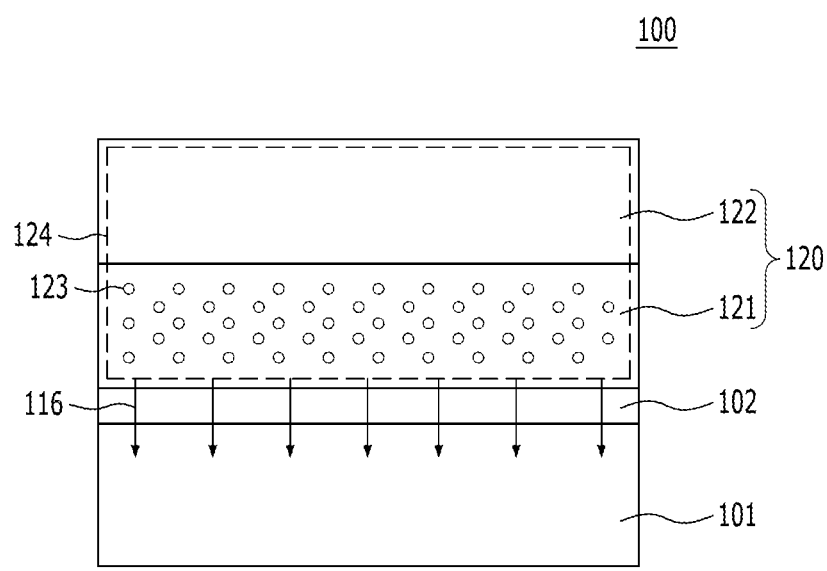
FIG. 2A is a view illustrating a method of applying a tensile stress to a stressed layer in accordance with an embodiment.

FIG. 2A is a view illustrating a method of applying a tensile stress to a stressed layer in a semiconductor structure.

Referring to FIG. 2A, a strained layer 120 has a stacked structure of a first silicon layer 121 and a second silicon layer 122. The stacked structure of the first silicon layer 121 and the second silicon layer 122 may be formed by forming an amorphous silicon layer and then selectively performing impurity doping and annealing on the amorphous silicon layer. A tensile strain 124 is generated by a lattice mismatch occurring between the first silicon layer 121 and the second silicon layer 122.

A strain generating element 123 is doped into any one silicon layer of the first silicon layer 121 and the second silicon layer 122. In an embodiment, the strain generating element 123 is doped into the first silicon layer 121 which is adjacent to a stressed layer 101. The strain generating element 123 includes an element that induces the lattice mismatch between the first silicon layer 121 and the second silicon layer 122. The strain generating element 123 includes an element which has an atomic radius larger than that of silicon. The strain generating element 123 may include arsenic (As).

The first silicon layer 121, which is doped with the strain generating element 123 (e.g., arsenic), and the second silicon layer 122, which is not doped with the strain generating element 123, are crystallized by annealing. As a result of such crystallization, a lattice mismatch occurs between the first silicon layer 121, which is doped with arsenic, and the second silicon layer 122, which is not doped with arsenic, and the tensile strain 124 is generated by the lattice mismatch. Thus, a tensile stress 116 is applied to the stressed layer 101 by the tensile strain 124.

Figure 2B:
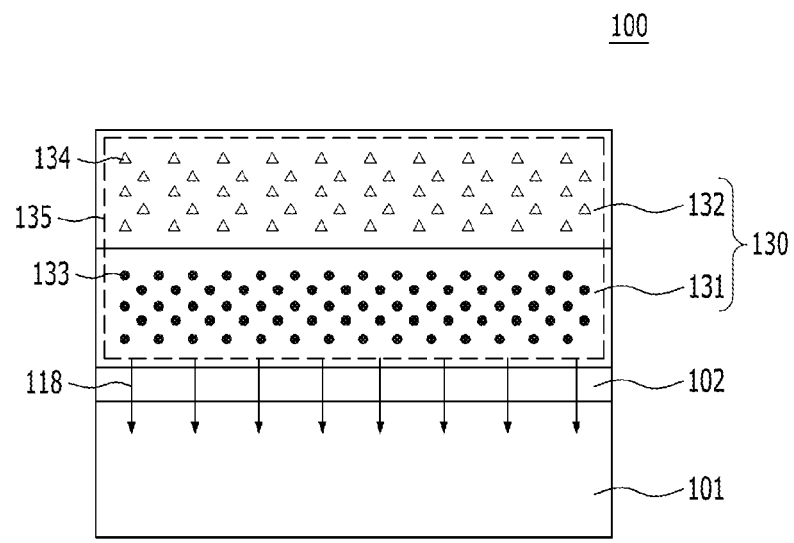
FIG. 2B is a view illustrating a method of applying a compressive stress to a stressed layer in accordance with an embodiment.

FIG. 2B is a view illustrating a method of applying a compressive stress to a stressed layer in a semiconductor structure.

Referring to FIG. 2B, a strained layer 130 has a stacked structure of a first silicon layer 131 and a second silicon layer 132. The stacked structure of the first silicon layer 131 and the second silicon layer 132 may be formed by forming an amorphous silicon layer and then selectively performing impurity doping and annealing on the amorphous silicon layer. A compressive strain 135 is generated by a lattice mismatch occurring between the first silicon layer 131 and the second silicon layer 132. First and second strain generating elements 133 and 134 are respectively doped into the first silicon layer 131 and the second silicon layer 132. The first strain generating element 133 and the second strain generating element 134 include elements which induce the lattice mismatch between the first silicon layer 131 and the second silicon layer 132. The first strain generating element 133 and the second strain generating element 134 include elements which have different atomic radius from an atomic radius of silicon. The first strain generating element 133 includes an element which has an atomic radius smaller than that of silicon. The second strain generating element 134 includes an element which has an atomic radius larger than that of silicon. The first strain generating element 133 may include boron (B). The second strain generating element 134 may include germanium (Ge).

The first silicon layer 131, which is doped with the first strain generating element 133 (e.g., boron), and the second silicon layer 132, which is doped with the second strain generating element 134 (e.g., germanium), are crystallized by annealing. As a result of such crystallization, a lattice mismatch occurs between the first silicon layer 131, which is doped with boron, and the second silicon layer 132, which is doped with germanium, and the compressive strain 135 is generated by the lattice mismatch. Thus, a compressive stress 118 is applied to a stressed layer 101 by the compressive strain 135.

Figure 3:
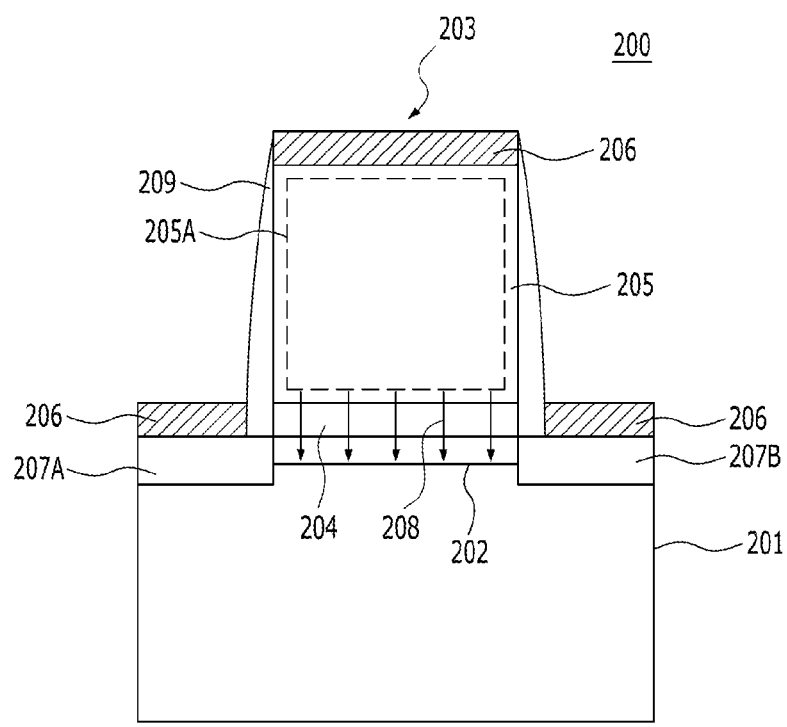
FIG. 3 is a cross-sectional view illustrating a transistor in accordance with an embodiment.

FIG. 3 is a cross-sectional view illustrating a transistor in accordance with an embodiment.

Referring to FIG. 3, a transistor 200 includes a channel 202 which is formed in a substrate 201, and a gate structure 203 which is formed on the channel 202. The channel 202 is formed between a source region 207A and a drain region 207B. The gate structure 203 includes a gate dielectric layer 204, a gate electrode 205, and a metal silicide layer 206. The metal silicide layer 206 may include a silicide layer which contains nickel (Ni) and platinum (Pt).

Gate resistance of the gate structure 203 is reduced by the metal silicide layer 206. The metal silicide layer 206 may also be formed on the source region 207A and the drain region 207B. Spacers 209 are formed on both sidewalls of the gate structure 203. The gate electrode 205 includes a crystalline silicon layer which is formed by crystalizing an amorphous silicon layer.

A stress 208 is applied from the gate electrode 205 to the channel 202. In an embodiment, a strain generating element is doped into the gate electrode 205. Thus, a lattice mismatch occurs in the gate electrode 205 because of the strain generating element. A strain 205A is generated in the gate electrode 205 by the lattice mismatch, and thus the stress 208 is applied to the channel 202 by the strain 205A. The strain 205A may be generated as described above with reference to FIG. 2A or 2B. The strain 205A may be a tensile strain or a compressive strain.

In FIG. 3, the gate electrode 205 in which the strain 205A is generated is referred to as a strained gate electrode. The channel 202 to which the stress 208 is applied is referred to as a stressed channel. A tensile-stressed channel is formed by a tensile strain. A compressive-stressed channel is formed by a compressive strain.

Accordingly, the transistor 200 may be referred to as a stressed channel transistor.

As the stress 208 induced by the strain 205A of the gate electrode 205 is applied to the channel 202, the carrier mobility of the channel 202 may be increased. The carrier mobility is the mobility of major carriers. For example, the electron mobility of an N-channel transistor is increased by applying a tensile stress induced by a tensile strain applied to an N channel. The hole mobility of a P channel transistor is increased by applying a compressive stress induced by a compressive strain applied to a P channel. If the carrier mobility is increased, a driving current of the transistor 200 may be increased, and thus the performance of the transistor 200 may be improved.

Figure 4:
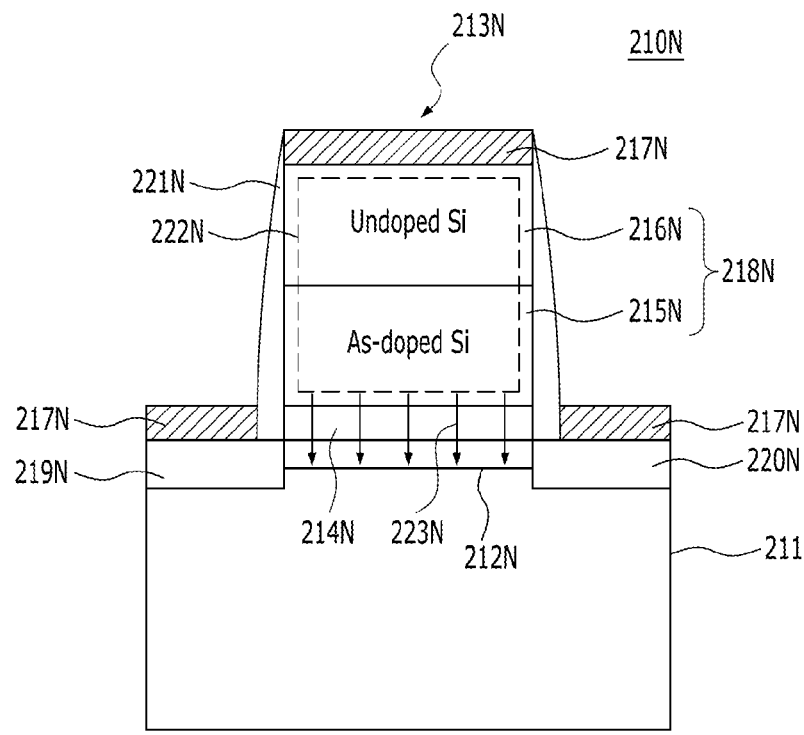
FIG. 4 is a cross-sectional view illustrating an N channel transistor in accordance with an embodiment.

FIG. 4 is a cross-sectional view illustrating an N channel transistor in accordance with an embodiment.

Referring to FIG. 4, an N channel transistor 210N includes an N channel 212N, which is formed in a substrate 211, and a gate structure 213N that is formed on the N channel 212N. The N channel 212N is formed between an N-type source region 219N and an N-type drain region 220N. The gate structure 213N includes a gate electrode 218N, which applies a tensile stress 223N to the N channel 212N.

The gate electrode 218N is doped with a strain generating element. Thus, a lattice mismatch occurs in the gate electrode 218N because of the strain generating element. A tensile strain 222N is generated in the gate electrode 218N by the lattice mismatch, and the strained gate electrode 218N applies the tensile stress 223N to the N channel 212N. The N channel transistor 210N becomes a stressed N channel transistor.

The gate structure 213N further includes a gate dielectric layer 214N formed below the gate electrode 218N and a metal silicide layer 217N formed on the gate electrode 218N. The metal silicide layer 217N may include a silicide layer which contains nickel (Ni) and platinum (Pt). Gate resistance of the gate structure 213N is reduced by the metal silicide layer 217N. The metal silicide layer 217N may also be formed on the N-type source region 219N and the N-type drain region 220N. Spacers 221N are formed on both sidewalls of the gate structure 213N.

The gate electrode 218N has a stacked structure of a first silicon layer 215N and a second silicon layer 216N. The first silicon layer 215N and the second silicon layer 216N include crystalline silicon layers. A strain generating element is doped into the first silicon layer 215N, whereas a strain generating element is not doped into the second silicon layer 216N. The strain generating element has an atomic radius that is larger than the atomic radius of silicon.

In an embodiment, arsenic (As) is doped into the first silicon layer 215N. Arsenic is an element which has an atomic radius larger than that of silicon. Since the first silicon layer 215N is doped with arsenic while the second silicon layer 216N is not doped with arsenic, a lattice mismatch occurs between the first silicon layer 215N and the second silicon layer 216N. Thus, the tensile strain 222N is generated in the gate electrode 218N because of the lattice mismatch. The tensile strain 222N applies the tensile stress 223N to the N channel 212N.

As the tensile stress 223N is applied to the N channel 212N, the electron mobility of the N channel 212N may be increased.

If the electron mobility is increased, a driving current of the N channel transistor 210N may be increased, and thus the performance of the N channel transistor 210N may be improved.

Figure 5:
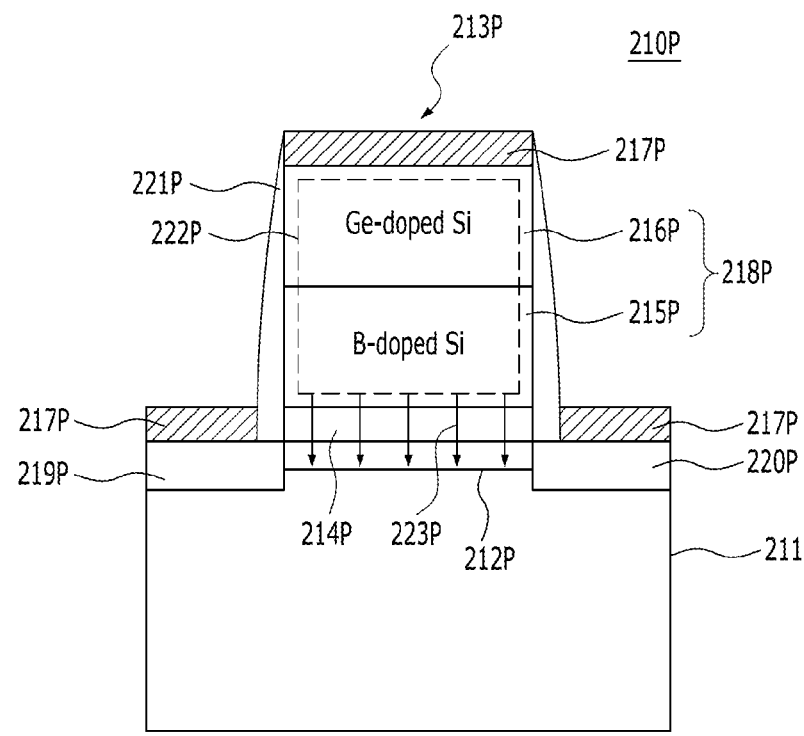
FIG. 5 is a cross-sectional view illustrating a P channel transistor in accordance with an embodiment.

FIG. 5 is a cross-sectional view illustrating a P channel transistor in accordance with an embodiment.

Referring to FIG. 5, a P channel transistor 210P includes a P channel 212P, which is formed in a substrate 211, and a gate structure 213P that is formed on the P channel 212P. The P channel 212P is formed between a P-type source region 219P and a P-type drain region 220P. The gate structure 213P includes a gate electrode 218P which applies a compressive stress 223P to the P channel 212P. The gate electrode 218P is doped with a strain generating element. Thus, a lattice mismatch occurs in the gate electrode 218P by the strain generating element. A compressive strain 222P is generated in the gate electrode 218P by the lattice mismatch, and the strained gate electrode 218P applies the compressive stress 223P to the P channel 212P. The P channel transistor 210P becomes a stressed P channel transistor.

The gate structure 213P further includes a gate dielectric layer 214P formed below the gate electrode 218P and a metal silicide layer 217P formed on the gate electrode 218P. The metal silicide layer 217P may include a silicide layer which contains nickel (Ni) and platinum (Pt). Gate resistance of the gate structure 213P is reduced by the metal silicide layer 217P. The metal silicide layer 217P may also be formed on the P-type source region 219P and the P-type drain region 220P.

Spacers 221P are formed on both sidewalls of the gate structure 213P. The gate electrode 218P includes a stacked structure of a first silicon layer 215P and a second silicon layer 216P. The first silicon layer 215P and the second silicon layer 216P include crystalline silicon layers. A first element that has an atomic radius smaller than that of silicon is doped into the first silicon layer 215P. In an embodiment, the first element is boron (B). A second element that has an atomic radius larger than that of silicon is doped into the second silicon layer 216P. In an embodiment, the second element is germanium (Ge).

Since the first silicon layer 215P is doped with the first element (e.g., boron) while the second silicon layer 216P is doped with the second element (e.g., germanium), a lattice mismatch occurs between the first silicon layer 215P and the second silicon layer 216P. Thus, the compressive strain 222P is generated in the gate electrode 218P because of the lattice mismatch. The compressive strain 222P applies the compressive stress 223P to the P channel 212P.

As the compressive stress 223P is applied to the P channel 212P, the hole mobility of the P channel 212P may be increased. If the hole mobility is increased, a driving current of the P channel transistor 210P may be increased, and thus the performance of the P channel transistor 210P may be improved.

A stressed channel transistor according to an embodiment may be a field effect transistor (FET), such as a metal oxide semiconductor FET (MOSFET) or a metal insulator semiconductor FET (MISFET). For example, in an embodiment, the N-channel transistor 210N shown in FIG. 4 is an N-type MOSFET (NMOSFET), and the P channel transistor 210P shown in FIG. 5 includes a P-type MOSFET (PMOSFET).

Further, a stressed channel transistor according to an embodiment may be a planar transistor. A planar transistor is a transistor which has a horizontal channel.

A stressed channel transistor according to an embodiment may be also applied to a non-planar transistor. A non-planar transistor is a transistor which has a channel having a channel length longer than that of a horizontal channel in a planar transistor. Non-planar transistors include fin-type transistors (FinFETs), buried gate transistors, vertical channel transistors, and so forth.

Figure 6:
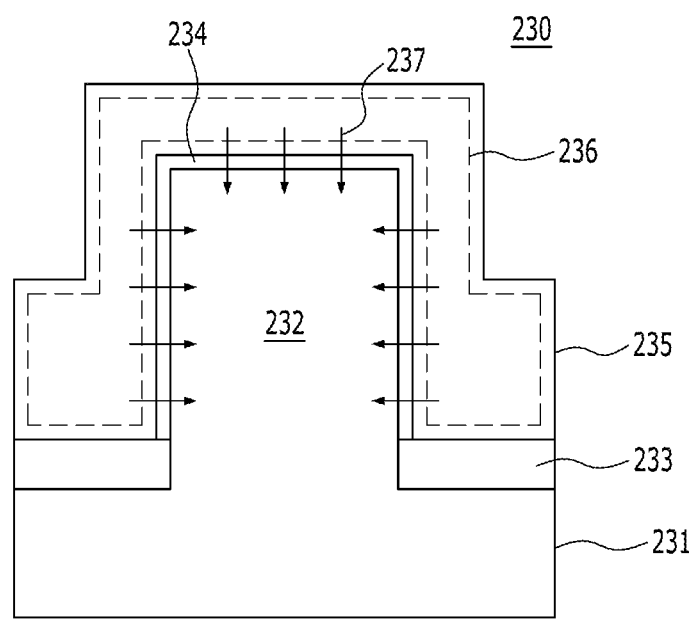
FIG. 6 is a view illustrating a fin type transistor in accordance with an embodiment.

FIG. 6 is a view illustrating a fin-type transistor 230 in accordance with an embodiment.

Referring to FIG. 6, the fin-type transistor 230 includes a fin-type channel 232, which is formed on a substrate 231, and a gate electrode 235. A gate dielectric layer 234 is formed on the fin-type channel 232. A bottom portion of the fin-type channel 232 is buried in a dielectric layer 233.

The gate electrode 235 is doped with a strain generating element. A lattice mismatch occurs in the gate electrode 235 because of the strain generating element, and a strain 236 is generated in the gate electrode 235 because of the lattice mismatch. Thus, the strained gate electrode 235 applies a stress 237 to the fin-type channel 232.

For a method for generating the strain 236 in the gate electrode 235, reference may be made to the embodiments described above with reference to FIGS. 2A and 2B.

Figure 7:
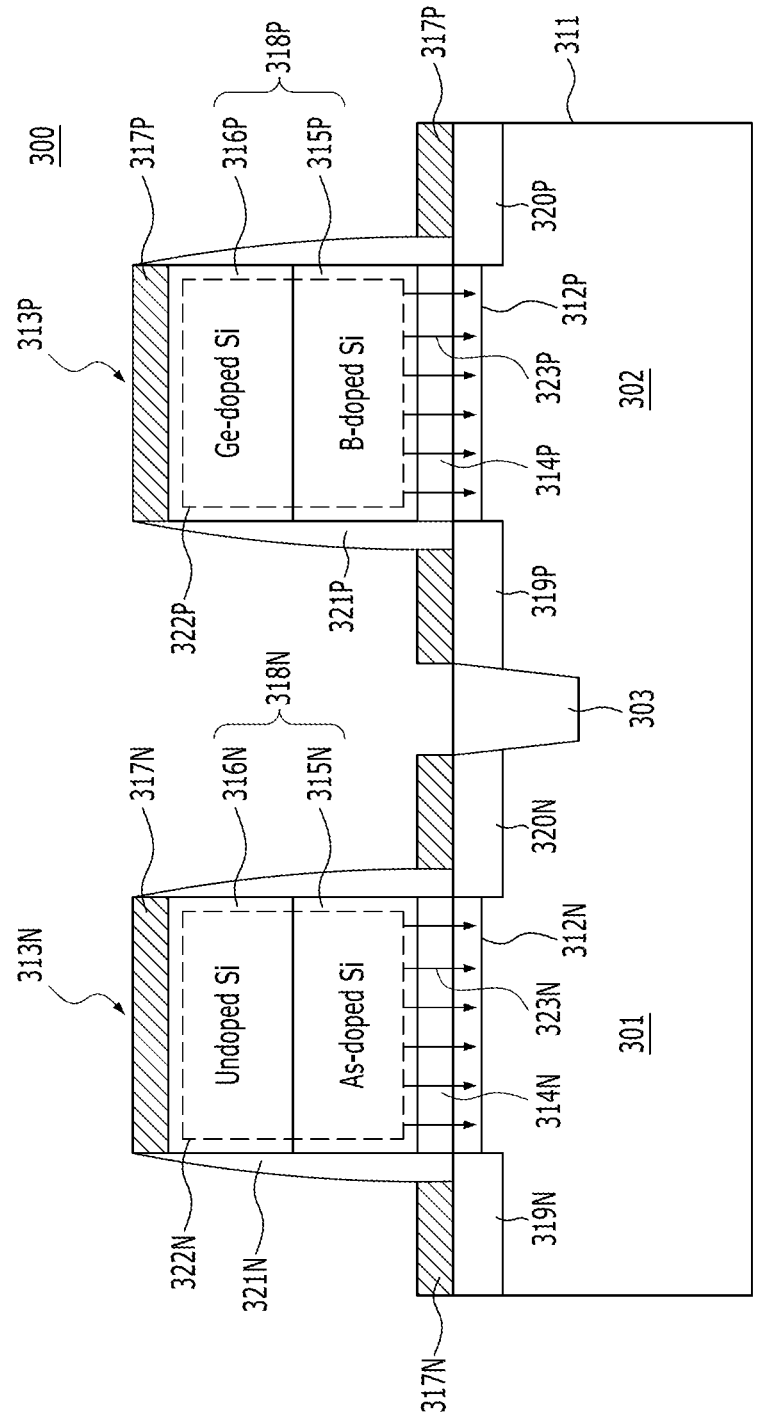
FIG. 7 is a view illustrating a semiconductor device in accordance with an embodiment.

FIG. 7 is a cross-sectional view illustrating a semiconductor device 300 in accordance with an embodiment. The semiconductor device 300 includes a plurality of transistors. The semiconductor device 300 may include a complementary metal-oxide-semiconductor field-effect transistor (CMOSFET) or a complementary metal-insulator-semiconductor field-effect transistor (CMISFET).

Referring to FIG. 7, the plurality of transistors includes a first transistor 301 and a second transistor 302. The first transistor 301 and the second transistor 302 are separated from each other by an isolation layer 303.

The first transistor 301 includes a first stressed channel 312N, which is formed in a substrate 311, and a first gate structure 313N that is formed on the first stressed channel 312N. The first stressed channel 312N is formed between a first source region 319N and a first drain region 320N. The first gate structure 313N includes a first strained gate electrode 318N, which applies a tensile stress 323N to the first stressed channel 312N. The first gate structure 313N further includes a first gate dielectric layer 314N formed below the first strained gate electrode 318N and a first metal silicide layer 317N formed on the first strained gate electrode 318N. First spacers 321N are formed on both sidewalls of the first gate structure 313N.

The first strained gate electrode 318N has a stacked structure of a first silicon layer 315N and a second silicon layer 316N. The first silicon layer 315N and the second silicon layer 316N include crystalline silicon layers. An element having an atomic radius larger than that of silicon is doped into the first silicon layer 315N. In an embodiment, the element is arsenic (As). The element, e.g., arsenic, is not doped into the second silicon layer 316N. Since the first silicon layer 315N is doped with arsenic while the second silicon layer 316N is not doped with arsenic, a lattice mismatch occurs between the first silicon layer 315N and the second silicon layer 316N. A tensile strain 322N is generated in the first strained gate electrode 318N because of the lattice mismatch, and the tensile strain 322N applies the tensile stress 323N to the first stressed channel 312N. As a result, the first stressed channel 312N becomes a tensile-stressed channel.

The second transistor 302 includes a second stressed channel 312P, which is formed in the substrate 311, and a second gate structure 313P that is formed on the second stressed channel 312P. The second stressed channel 312P is formed between a second source region 319P and a second drain region 320P. The second gate structure 313P includes a second strained gate electrode 318P, which applies a compressive stress 323P to the second stressed channel 312P. The second gate structure 313P further includes a second gate dielectric layer 314P formed below the second strained gate electrode 318P and a second metal silicide layer 317P formed on the second strained gate electrode 318P. Second spacers 321P are formed on both sidewalls of the second gate structure 313P.

The second strained gate electrode 318P includes a stacked structure of a third silicon layer 315P and a fourth silicon layer 316P. The third silicon layer 315P and the fourth silicon layer 316P include crystalline silicon layers. A first element which has an atomic radius smaller than that of silicon is doped into the third silicon layer 315P. In an embodiment, the first element is boron (B). A second element which has an atomic radius larger than that of silicon is doped into the fourth silicon layer 316P. In an embodiment, the second element is germanium (Ge). Since the third silicon layer 315P is doped with the first element (e.g., boron) while the fourth silicon layer 316P is doped with the second element (e.g., germanium), a lattice mismatch occurs between the third silicon layer 315P and the fourth silicon layer 316P. A compressive strain 322P is generated in the second strained gate electrode 318P by the lattice mismatch. The compressive strain 322P applies the compressive stress 323P to the second stressed channel 312P. As a result, the second stressed channel 312P becomes a compressive-stressed channel.

Referring to FIG. 7, the semiconductor device 300 includes the first strained gate electrode 318N and the second strained gate electrode 318P in which different types of strains are generated. Accordingly, the semiconductor device 300 has the first stressed channel 312N and the second stressed channel 312P to which different types of stresses are applied.

In this way, the semiconductor device 300 includes a plurality of transistors having different types of strained gate electrodes and different types of stressed channels. The performance of the first transistor 301 is improved by applying the tensile stress 323N to the first stressed channel 312N. The performance of the second transistor 302 is improved by applying the compressive stress 323P to the second stressed channel 312P.

In the semiconductor device 300 having the plurality of transistors with improved performance, a driving speed may be increased, and power consumption may be reduced.

FIGS. 8A to 8I are cross-sectional views illustrating a method for fabricating the semiconductor devices shown in FIG. 7 in accordance with an embodiment.

Figure 8A:
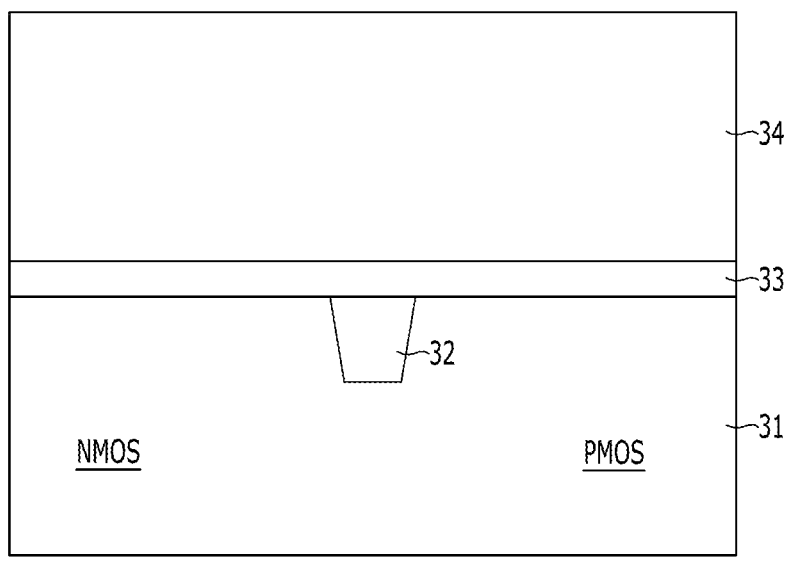
FIGS. 8A to 8I are cross-sectional views illustrating a method for fabricating the semiconductor device shown in FIG. 7 in accordance with an embodiment.

Referring to FIG. 8A, an isolation layer 32 is formed in a substrate 31. The substrate 31 may include silicon, germanium, or silicon-germanium, but embodiments are not limited thereto.

The isolation layer 32 may be formed by a shallow trench isolation (STI) process. In an embodiment, after forming a pad layer (not shown) on the substrate 31, the pad layer and the substrate 31 are etched using an isolation mask (not shown) to form a trench in the substrate 31. After forming the trench, the isolation layer 32 is formed by filling the trench with a dielectric material. The isolation layer 32 may include a wall oxide layer, a liner, and a gap-fill dielectric layer that are sequentially formed. The liner may be formed by stacking a silicon nitride layer and a silicon oxide layer. The silicon nitride layer may include $Si_3N_4$, and the silicon oxide layer may include $SiO_2$. The gap-fill dielectric layer may include a spin-on dielectric (SOD) layer. In another embodiment, the isolation layer 32 may use a silicon nitride layer as the gap-fill dielectric layer.

A first region NMOS and a second region PMOS are separated from each other by the isolation layer 32. The first region NMOS is a region where an NMOSFET is to be formed. The second region PMOS is a region where a PMOSFET is to be formed. Although not shown, wells may be formed in the substrate 31 by performing a well forming process known in the art. A P-type well may be formed in the first region NMOS. An N-type well may be formed in the second region PMOS.

Subsequently, a gate dielectric layer 33 is formed on the substrate 31 and the isolation layer 32. The gate dielectric layer 33 may include silicon oxide, silicon nitride or a high-k material. The high-k material is a material which has a higher dielectric constant than silicon oxide. The high-k material may be a metal-containing material such as metal oxide, metal silicate, or metal silicate nitride.

The metal oxide may contain a metal such as hafnium (Hf), aluminum (Al), lanthanum (La), and Zirconium (Zr). Thus, the metal oxide may include a hafnium oxide ($HfO_2$), an aluminum oxide ($Al_2O_3$), a lanthanum oxide ($La_2O_3$), a zirconium oxide ($ZrO_2$), or a combination thereof. The metal silicate may contain a metal such as hafnium (Hf) and Zirconium (Zr). Thus, the metal silicate may include a hafnium silicate (HfSiO), a zirconium silicate (ZrSiOx), or a combination thereof. The metal silicate nitride may include a material which is prepared by mixing nitrogen with metal silicate. Thus, the metal silicate nitride may include a hafnium silicate nitride (HfSiON).

When the gate dielectric layer 33 is formed using the metal silicate nitride, a dielectric constant may be increased, and thus crystallization may be suppressed in a subsequent thermal process. A process for forming the gate dielectric layer 33 may include a deposition technology that is appropriate for the material to be deposited. The deposition technology may include chemical vapor deposition (CVD), low-pressure CVD (LPCVD), plasma-enhanced CVD (PECVD), metal-organic CVD (MOCVD), atomic layer deposition (ALD), plasma enhanced ALD (PEALD), and so forth. For forming a uniform layer, the plasma-enhanced ALD (PEALD) may be used. When a high-k material is applied as the gate dielectric layer 33, an interfacial layer may be additionally formed under the high-k material.

A silicon layer 34 is formed on the gate dielectric layer 33. The silicon layer 34 may include a material which is to be formed as a gate electrode. The silicon layer 34 may include an undoped silicon layer which is not doped with an impurity. The silicon layer 34 may include an undoped amorphous silicon layer.

Figure 8B:
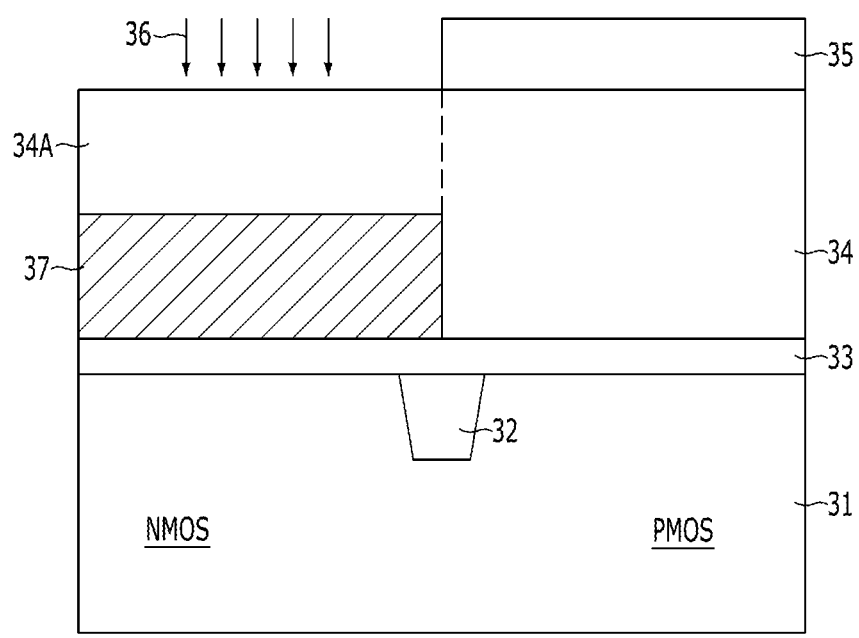

Referring to FIG. 8B, a first doping process 36 is performed on the silicon layer 34 over the first region NMOS. The first doping process 36 is performed using a first mask layer 35. The first mask layer 35 covers any one region of the first region NMOS and the second region PMOS. In FIG. 8B, the first mask layer 35 covers the second region PMOS.

In the first doping process 36, an impurity having a larger atomic radius than that of silicon, e.g., arsenic (As), is implanted into the silicon layer 34 of the first region NMOS. As a result, a first doped silicon layer 37 is formed in the silicon layer 34 of the first region NMOS, and the remaining portion of the silicon layer 34, which is not doped with arsenic, becomes an undoped silicon layer 34A. The first doped silicon layer 37 may be formed adjacent to the gate dielectric layer 33. Accordingly, a first stacked structure of the first doped silicon layer 37 and the undoped silicon layer 34A is formed on the substrate 31 of the first region NMOS. The first doped silicon layer 37 is an arsenic-doped amorphous silicon layer.

Figure 8C:
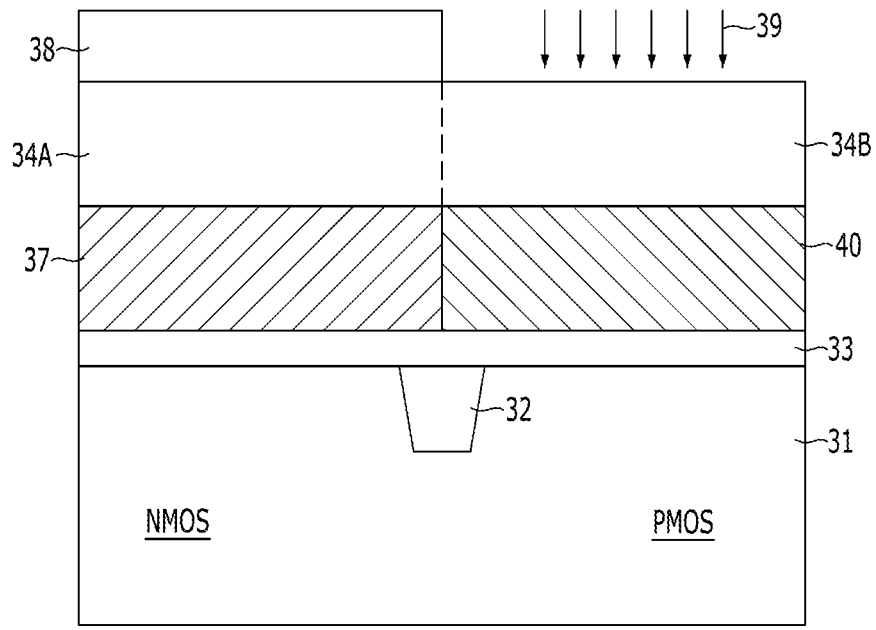

Referring to FIG. 8C, after removing the first mask layer 35, a second doping process 39 is performed on the silicon layer 34 over the second region PMOS. The second doping process 39 is performed using a second mask layer 38 that covers the first region NMOS and exposes the silicon layer 34 of the second region PMOS.

In the second doping process 39, an impurity having an atomic radius that is smaller than that of silicon, e.g., boron, is implanted into the silicon layer 34 of the second region PMOS. As a result, a second doped silicon layer 40 is formed in the silicon layer 34 of the second region PMOS, and the remaining portion of the silicon layer 34, which is not doped with boron, becomes an undoped silicon layer 34B. The second doped silicon layer 40 may be formed adjacent to the gate dielectric layer 33. Accordingly, a stacked structure of the second doped silicon layer 40 and the undoped silicon layer 34B is formed on the substrate 31 of the second region PMOS. In an embodiment, the second doped silicon layer 40 is a boron-doped amorphous silicon layer.

Figure 8D:
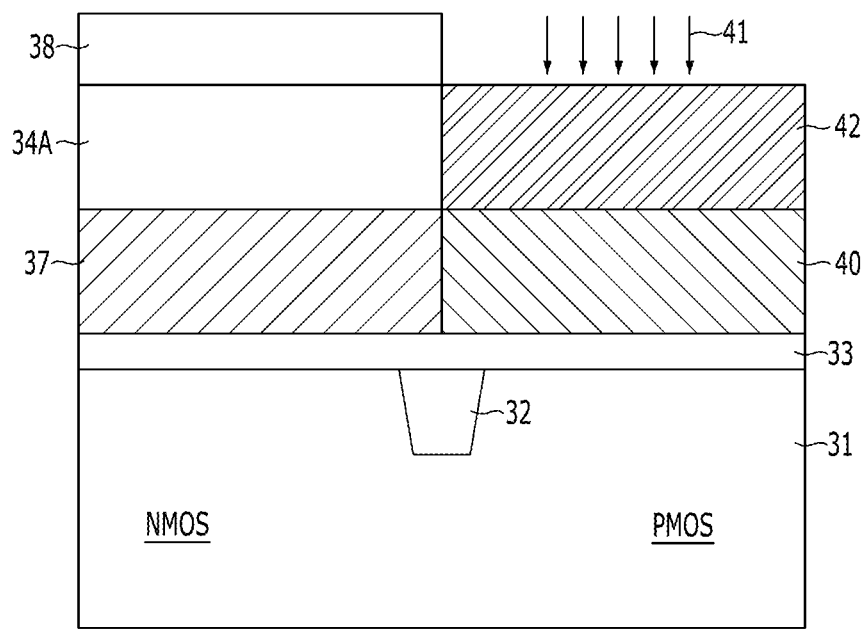

Referring to FIG. 8D, a third doping process 41 is performed on the undoped silicon layer 34B. The third doping process 41 is performed using the second mask layer 38. In the third doping process 41, an impurity having a larger atomic radius than that of silicon, e.g., germanium (Ge), is implanted into the undoped silicon layer 34B of the second region PMOS. As a result, a third doped silicon layer 42 is formed. In an embodiment, the third doped silicon layer 42 is a germanium-doped amorphous silicon layer.

The third doped silicon layer 42 is positioned on the second doped silicon layer 40. Accordingly, a second stacked structure of the second doped silicon layer 40 and the third doped silicon layer 42 is formed on the substrate 31 of the second region PMOS. The second doped silicon layer 40 and the third doped silicon layer 42 are formed so that boron and germanium are not mixed with each other. Therefore, layers that are lattice-mismatched may be easily formed through a subsequent annealing process. In contrast to the above-described embodiment, if boron is implanted after germanium or if boron is mixed with germanium, it is difficult to generate a compressive strain.

Figure 8E:
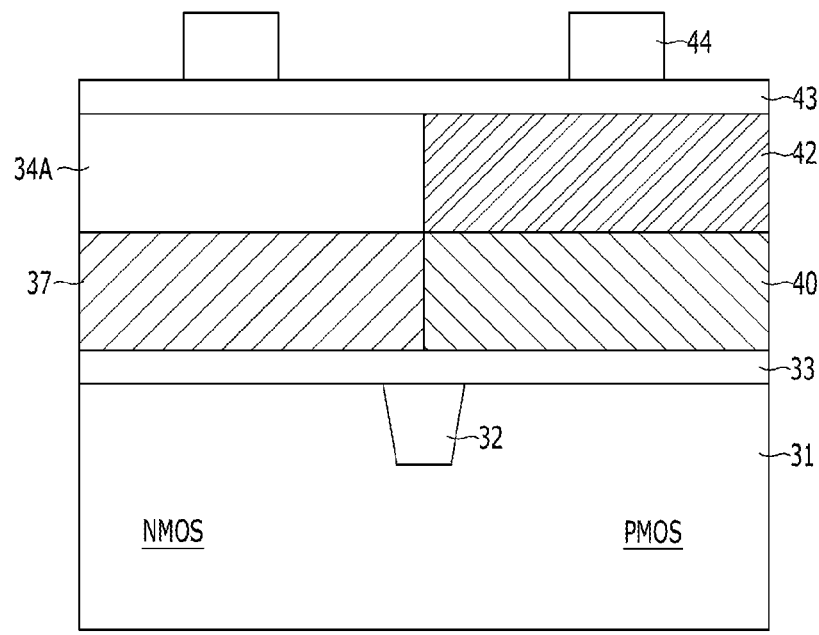

Referring to FIG. 8E, after removing the second mask layer 38, a hard mask layer 43 is formed over the first and second stacked structures. The hard mask layer 43 may include silicon nitride or silicon oxide.

After that, a third mask layer 44 is formed on the hard mask layer 43. The third mask layer 44 may serve as an etch mask for gate patterning.

Figure 8F:
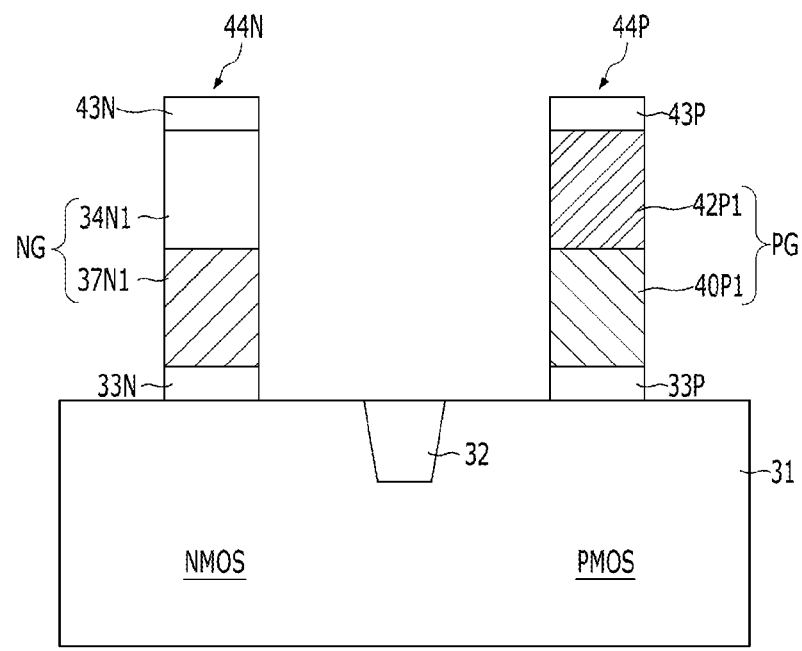

Referring to FIG. 8F, the gate patterning is performed using the third mask layer 44. In the gate patterning process, the hard mask layer 43, the first stacked structure, the second stacked structure, and the gate dielectric layer 33 are etched using the third mask layer 44.

As a result, a first gate structure 44N and a second gate structure 44P are formed. The first gate structure 44N is formed on the substrate 31 of the first region NMOS. The second gate structure 44P is formed on the substrate 31 of the second region PMOS.

The first gate structure 44N includes a first gate dielectric layer 33N, a first gate electrode NG, and a first hard mask layer 43N. The second gate structure 44P includes a second gate dielectric layer 33P, a second gate electrode PG, and a second hard mask layer 43P. The first gate dielectric layer 33N and the second gate dielectric layer 33P are formed by etching the gate dielectric layer 33. The first gate electrode NG is formed by etching the first doped silicon layer 37 and the undoped silicon layer 34A. The second gate electrode PG is formed by etching the second doped silicon layer 40 and the third doped silicon layer 42. The first hard mask layer 43N and the second hard mask layer 43P are formed by etching the hard mask layer 43.

The first gate electrode NG includes a first doped silicon layer 37N1, which is doped with an element having an atomic radius that is larger than silicon, e.g., arsenic, and an undoped silicon layer 34N1 that is not doped with arsenic. Hereinafter, for convenience of illustration, the first doped silicon layer 37N1 will be described as a layer that is doped with arsenic. However, one of skill in the art will understand that the first doped layer may be doped with another element having an atomic radius larger than that of silicon. The first doped silicon layer 37N1 and the undoped silicon layer 34N1 are amorphous silicon layers.

The second gate electrode PG includes a second doped silicon layer 40P1, which is doped with an element having an atomic radius that is smaller than silicon, e.g., boron, and a third doped silicon layer 42P1 that is doped with an element having an atomic radius that is larger than silicon, e.g., germanium. The second doped silicon layer 40P1 and the third doped silicon layer 42P1 are amorphous silicon layers. Hereinafter, for convenience of illustration, the second doped silicon layer 40P1 will be described to as a layer that is doped with boron and the third doped silicon layer 42P1 will be described to as a layer that is doped with germanium. However, embodiments are not limited thereto. One of skill in the art will understand that the second doped silicon layer 40P1 may be doped with another element having an atomic radius smaller than that of silicon, and that the third doped silicon layer may be doped with another element having an atomic radius that is larger than that of silicon.

Figure 8G:
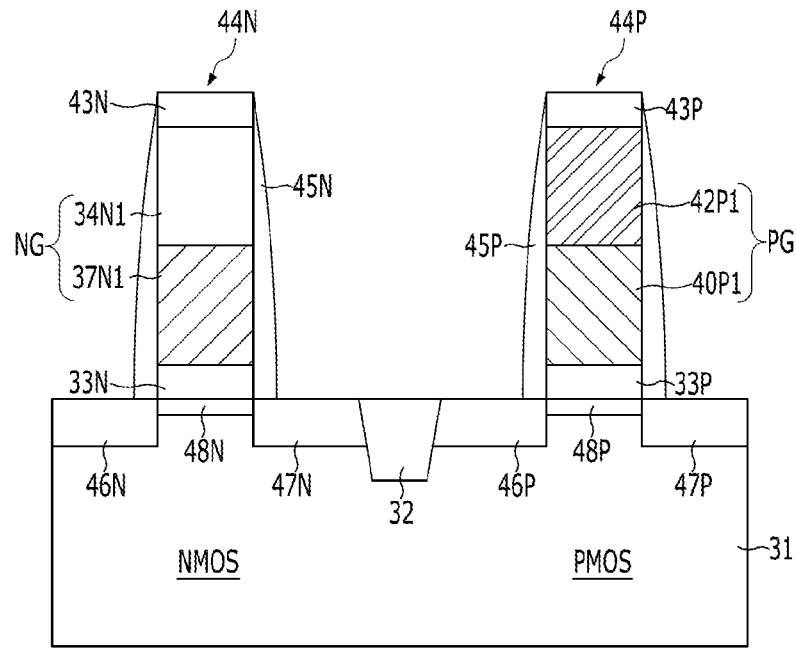

Referring to FIG. 8G, first spacers 45N and second spacers 45P are formed. The first spacers 45N are formed on both sidewalls of the first gate structure 44N. The second spacers 45P are formed on both sidewalls of the second gate structure 44P. The first spacers 45N and the second spacers 45P may include silicon nitride. In an embodiment, the first spacers 45N and the second spacers 45P may have a multi-layered spacer structure which includes a silicon oxide layer and a silicon nitride layer.

Subsequently, a first source region 46N, a first drain region 47N, a second source region 46P, and a second drain region 47P are formed in the substrate 31 by implanting impurities into the substrate 31. The first source region 46N and the first drain region 47N are formed in the substrate 31 of the first region NMOS. The first source region 46N and the first drain region 47N are formed using an N-type impurity. The second source region 46P and the second drain region 47P are formed in the substrate 31 of the second region PMOS. The second source region 46P and the second drain region 47P are formed using a P-type impurity.

A first channel 48N is formed under the first gate structure 44N and between the first source region 46N and the first drain region 47N. The first channel 48N becomes a channel of an NMOSFET. A second channel 48P is formed under the second gate structure 44P and between the second source region 46P and the second drain region 47P. The second channel 48P becomes a channel of a PMOSFET. Each of the first source region 46N, the first drain region 47N, the second source region 46P, and the second drain region 47P may have a structure which further includes lightly doped sources/drains (LDDs) or source/drain extensions (SDEs). The LDDs or the SDEs may be formed by implanting impurities into the substrate 31 before forming the first spacers 45N and the second spacers 45P.

Figure 8H:
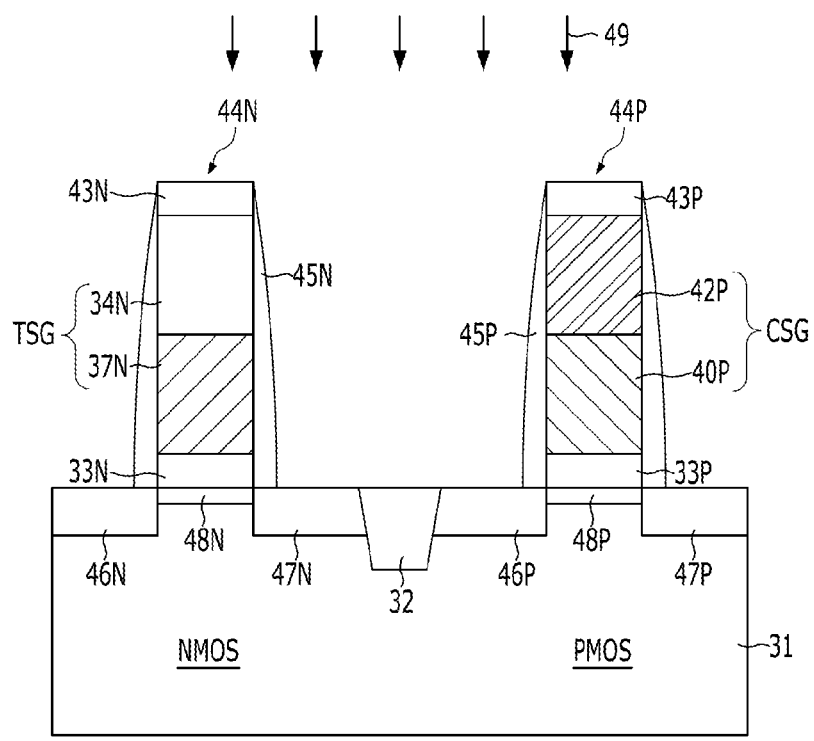

Referring to FIG. 8H, an annealing process 49, e.g., an activation annealing process, is performed on a resultant structure of FIG. 8G. In the annealing process 49, the impurities implanted into the first source region 46N, the first drain region 47N, the second source region 46P, and the second drain region 47P are activated.

By performing the annealing process 49, strain is generated in the first gate electrode NG and the second gate electrode PG. As a result, the first gate electrode NG is converted into a first strained gate electrode TSG. The second gate electrode PG is converted into a second strained gate electrode CSG. The strain is generated due to a lattice mismatch. The lattice mismatch occurs in the first strained gate electrode TSG and the second strained gate electrode CSG.

As a result of the annealing process 49, a lattice mismatch occurs between first doped silicon layer 37N1 and the undoped silicon layer 34N1. In other words, as the first doped silicon layer 37N1 and the undoped silicon layer 34N1 are crystallized by the annealing process 49, the lattice mismatch occurs owing to a difference in size between the atomic radius of silicon and arsenic. The first strained gate electrode TSG includes a crystalline first doped silicon layer 37N and a crystalline undoped silicon layer 34N. The crystalline first doped silicon layer 37N and the crystalline undoped silicon layer 34N form a first lattice-mismatched crystalline silicon layer. A tensile strain is generated by the first lattice-mismatched crystalline silicon layer. Accordingly, the first strained gate electrode TSG becomes a tensile strained gate electrode TSG.

As a result of the annealing process 49, a lattice mismatch occurs between the second doped silicon layer 40P1 doped with, e.g., boron and the third doped silicon layer 42P1 doped with, e.g., germanium. In other words, as the second doped silicon layer 40P1 doped with boron and the third doped silicon layer 42P1 doped with germanium are crystallized by the annealing process 49, the lattice mismatch occurs owing to a difference in size between the atomic radii of boron and germanium. The second strained gate electrode CSG includes a crystalline second doped silicon layer 40P and a crystalline third doped silicon layer 42P. The crystalline second doped silicon layer 40P and the crystalline third doped silicon layer 42P form a second lattice-mismatched crystalline silicon layer. A compressive strain is generated by the second lattice-mismatched crystalline silicon layer. Accordingly, the second strained gate electrode CSG becomes a compressive strained gate electrode CSG.

A tensile stress is applied to the first channel 48N by the first strained gate electrode TSG. A compressive stress is applied to the second channel 48P by the second strained gate electrode CSG. As a result, the first channel 48N becomes a tensile stressed channel, and the second channel 48P becomes a compressive stressed channel.

The annealing process 49 for forming the first strained gate electrode TSG and the second strained gate electrode CSG may include another annealing process that is performed after the activation annealing. For example, an annealing process for forming a silicide layer may be included.

Figure 8I:
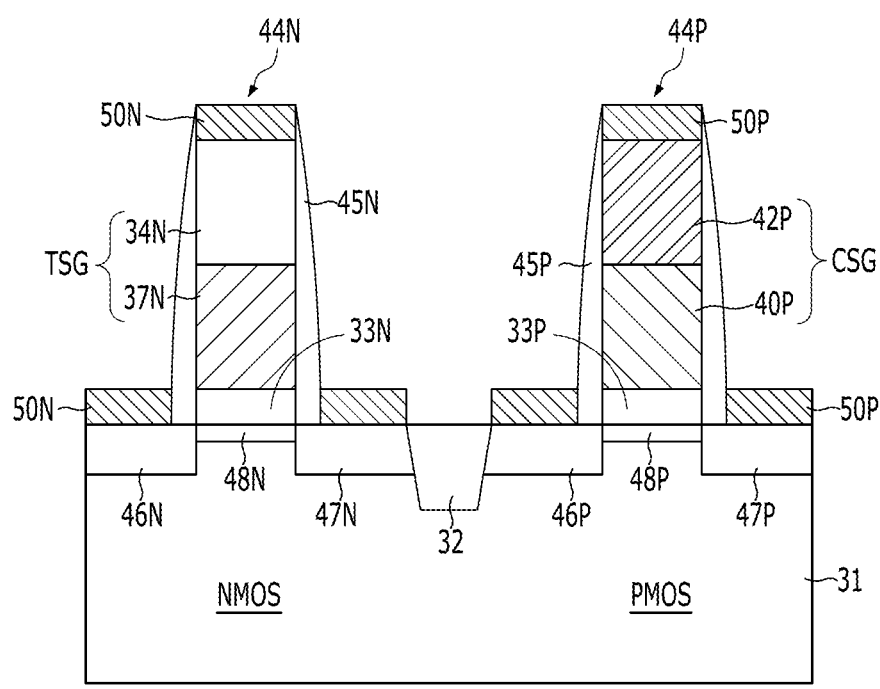

Referring to FIG. 8I, the first hard mask layer 43N and the second hard mask layer 43P are removed. Accordingly, top surfaces of the first strained gate electrode TSG and the second strained gate electrode CSG are exposed.

A first metal silicide layer 50N and a second metal silicide layer 50P are formed on the first strained gate electrode TSG and the second strained gate electrode CSG, respectively. The first metal silicide layer 50N and the second metal silicide layer 50P may include a silicide layer which contains nickel (Ni) and platinum (Pt). By the first metal silicide layer 50N and the second metal silicide layer 50P, gate resistance of the first gate structure 44N and that of the second gate structure 44P are reduced.

A method of forming the first metal silicide layer 50N and the second metal silicide layer 50P is described hereinafter. First, after depositing a Ni—Pt alloy layer in which nickel and platinum are mixed, an annealing process is performed. By the annealing process, the Ni—Pt alloy layer is silicidated. The first metal silicide layer 50N is formed on the first strained gate electrode TSG by the reaction between the Ni—Pt alloy layer and the crystalline undoped silicon layer 34N. The second metal silicide layer 50P is formed on the second strained gate electrode CSG by the reaction between the Ni—Pt alloy layer and the crystalline third doped silicon layer 42P.

The first metal silicide layer 50N may also be formed on the first source region 46N and the first drain region 47N. The second metal silicide layer 50P may also be formed on the second source region 46P and the second drain region 47P.

By a series of processes described above, an NMOSFET and a PMOSFET are formed. The NMOSFET includes the first source region 46N, the first drain region 47N, the first channel 48N, and the first gate structure 44N. The first gate structure 44N includes the first strained gate electrode TSG. The first channel 48N is a tensile stressed channel.

The PMOSFET includes the second source region 46P, the second drain region 47P, the second channel 48P, and the second gate structure 44P. The second gate structure 44P includes the second strained gate electrode CSG. The second channel 48P is a compressive stressed channel.

A stressed channel transistor according to an embodiment may be integrated in one transistor circuit together with a non-stressed channel transistor. The non-stressed channel transistor is a transistor having a channel to which a stress is not applied.

A stressed channel transistor according to an embodiment may be applied to integrated circuits including transistors for various purposes. In an embodiment, a stressed channel transistor may be applied to integrated circuits including an insulated gate FET (IGFET), a high electron mobility transistor (HEMT), a power transistor, a thin film transistor (TFT), and so forth.

A stressed channel transistor and integrated circuit according to embodiments may be employed in electronic devices. The electronic devices may include memory devices and non-memory devices. The memory devices may include an SRAM device, a DRAM device, a FLASH memory device, an MRAM device, a ReRAM device, an STTRAM device, a FeRAM device, and the like. The non-memory devices may include logic circuits. The logic circuits may include a sense amplifier, a decoder, an input/output circuit, and so forth, for controlling a memory device. Also, the logic circuits may include various ICs other than a memory device. For example, the logic circuits include a microprocessor, a mobile device, an application processor, and so forth. Furthermore, the non-memory devices include a logic gate such as a NAND gate, a driver IC for a display device, a power semiconductor device such as a power management IC (PMIC), and so forth. The electronic devices may include a computing system, an image sensor, a camera, a mobile device, a display device, a sensor, a medical instrument, an optoelectronic device, a radio frequency identification (RFID), a photovoltaic cell, a semiconductor device for an automobile, a semiconductor device for a railroad car, a semiconductor device for an aircraft, and so forth.

Hereafter, various applications of a stressed channel transistor according to an embodiment will be described.

Figure 9:
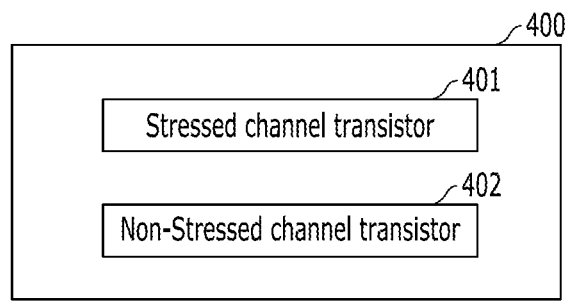
FIG. 9 is a diagram showing an integrated circuit according to an embodiment.

FIG. 9 is a diagram showing an integrated circuit (IC) 400 according to an embodiment.

Referring to FIG. 9, the integrated circuit 400 includes a plurality of stressed channel transistors 401 and a plurality of non-stressed channel transistors 402. The non-stressed channel transistors 402 include channels to which a stress is not applied in a manner in accordance with an embodiment.

The stressed channel transistors 401 are stressed channel transistors according to an embodiment. The stressed channel transistors 401 include stressed channels and strained gate electrodes, which include lattice-mismatched silicon layers. A stress is applied to the stressed channels by the strained gate electrodes.

FIGS. 10A to 10D are diagrams showing various applications of an integrated circuit according to embodiments.

Figure 10A:
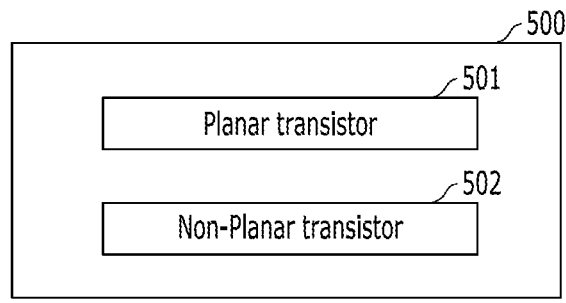
FIGS. 10A to 10D are diagrams showing various applications of an integrated circuit according to embodiments.

An integrated circuit 500 shown in FIG. 10A includes a plurality of planar transistors 501 and a plurality of non-planar transistors 502.

Figure 10B:
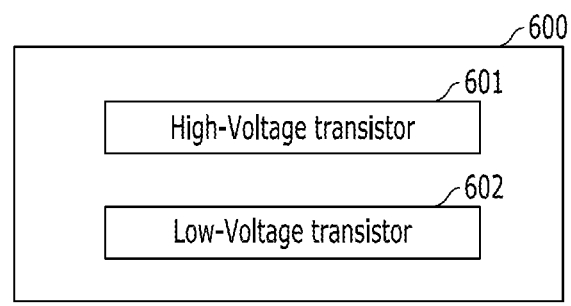

An integrated circuit 600 shown in FIG. 10B includes a plurality of high-voltage transistors 601 and a plurality of low-voltage transistors 602.

Figure 10C:
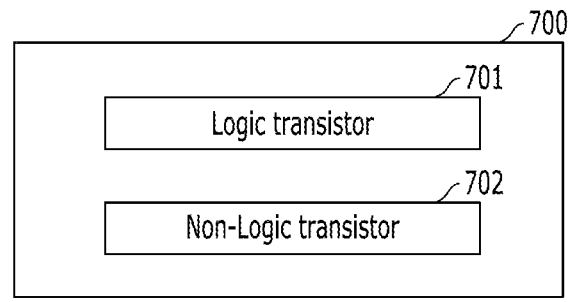

An integrated circuit 700 shown in FIG. 10C includes a plurality of logic transistors 701 and a plurality of non-logic transistors 702.

Figure 10D:
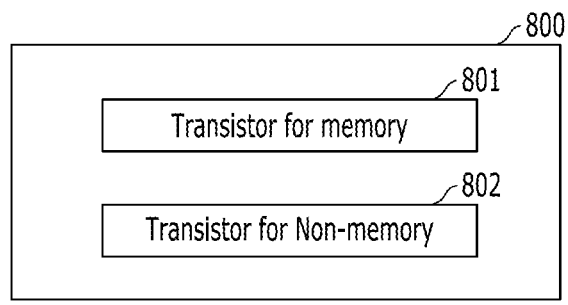

An integrated circuit 800 shown in FIG. 10D includes transistors 801 for a memory device and transistors 802 for a non-memory device.

The above-described planar transistors 501, non-planar transistors 502, high-voltage transistors 601, low-voltage transistors 602, logic transistors 701, non-logic transistors 702, transistors 801 for the memory device, and transistors 802 for the non-memory device may include stressed channel transistors according to an embodiment. The stressed channel transistors included in the integrated circuits 500, 600, 700, and 800 include stressed channels and strained gate electrodes including lattice-mismatched silicon layers. A stress is applied to the stressed channels by the strained gate electrodes. Therefore, it is possible to improve the performance of the integrated circuits 500, 600, 700, and 800.

Figure 11:
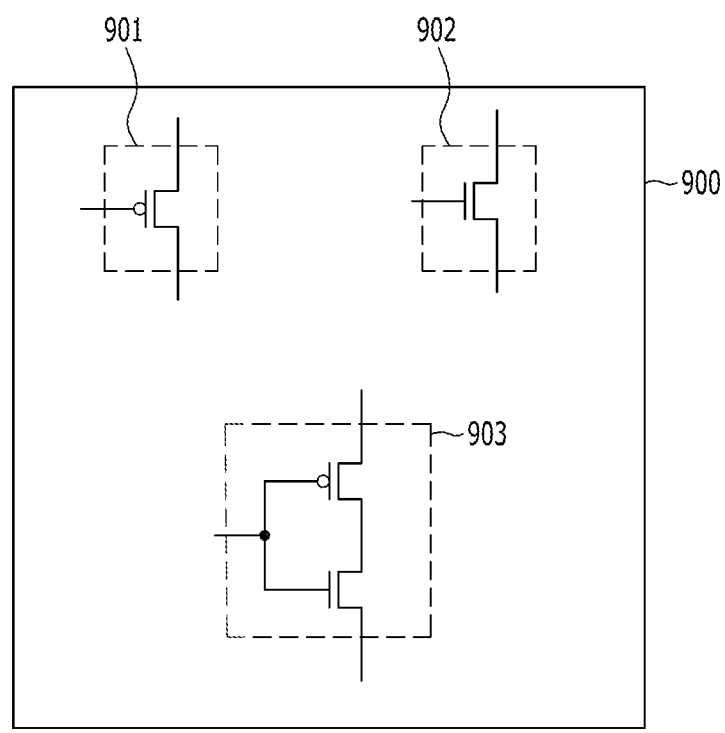
FIG. 11 is a diagram showing an electronic device according to an embodiment.

FIG. 11 is a diagram showing an electronic device 900 according to an embodiment.

Referring to FIG. 11, the electronic device 900 includes a plurality of stressed channel transistors. The electronic device 900 may include a plurality of PMOSFETs 901, a plurality of NMOSFETs 902 and a plurality of CMOSFETs 903. The PMOSFETs 901, the NMOSFETs 902, and the CMOSFETs 903 may include stressed channel transistors according to an embodiment. The stressed channel transistors included in the electronic device 900 include stressed channels and strained gate electrodes including lattice-mismatched silicon layers. A stress is applied to the stressed channels by the strained gate electrodes. Since the electronic device 900 includes the stressed channel transistors with improved performance, the electronic device 900 may realize high-speed operations even as it is scaled down.

Figure 12:
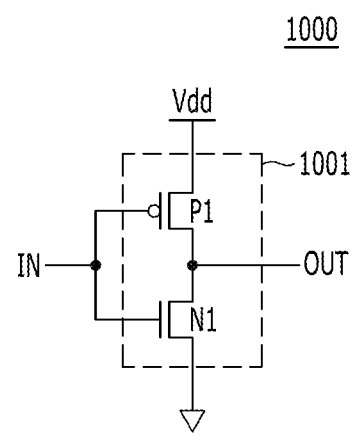
FIG. 12 is a circuit diagram showing an inverter according to an embodiment.

FIG. 12 is a circuit diagram showing an inverter 1000 according to an embodiment.

Referring to FIG. 12, the inverter 1000 may be implemented with a CMOSFET 1001. The CMOSFET 1001 includes a PMOSFET P1 and an NMOSFET N1 that are coupled in series between a power supply terminal Vdd and a ground terminal. The power supply terminal Vdd is coupled to a source of the PMOSFET P1, and the ground terminal is coupled to a source of the NMOSFET N1. The CMOSFET 1001 includes a stressed N channel, a stressed P channel, a first strained gate electrode formed on the stressed N channel, and a second strained gate electrode formed on the stressed P channel. The first strained gate electrode and the second strained gate electrode include lattice-mismatched silicon layers which induce strain to respectively apply different types of stress to the stressed N channel and the stressed P channel.

Figure 13:
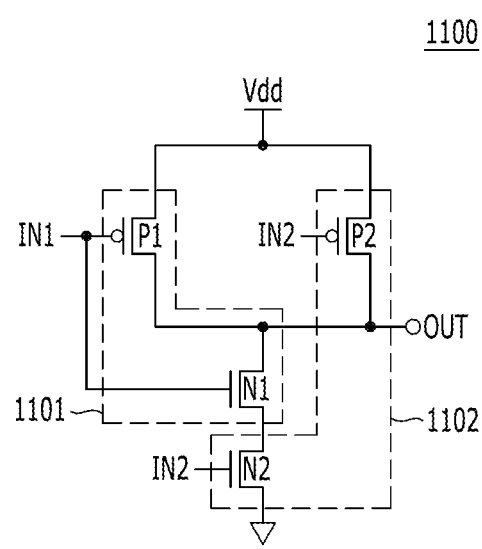
FIG. 13 is a circuit diagram showing a logic gate according to an embodiment.

FIG. 13 is a circuit diagram showing a logic gate according to an embodiment. FIG. 13 shows a NAND gate 1100.

Referring to FIG. 13, the NAND gate 1100 includes a first CMOSFET 1101 and a second CMOSFET 1102 which receive different input signals IN1 and IN2, respectively. The first CMOSFET 1101 includes a first PMOSFET P1 and a first NMOSFET N1 to which the first input signal IN1 is input. The second CMOSFET 1102 includes a second PMOSFET P2 and a second NMOSFET N2 to which the second input signal IN2 is input. Each of the first CMOSFET 1101 and the second CMOSFET 1102 includes a stressed N channel, a stressed P channel, a first strained gate electrode formed on the stressed N channel, and a second strained gate electrode formed on the stressed P channel. The first strained gate electrode and the second strained gate electrode include lattice-mismatched silicon layers which induce strains for respectively applying different types of stresses to the stressed N channel and the stressed P channel.

Figure 14:
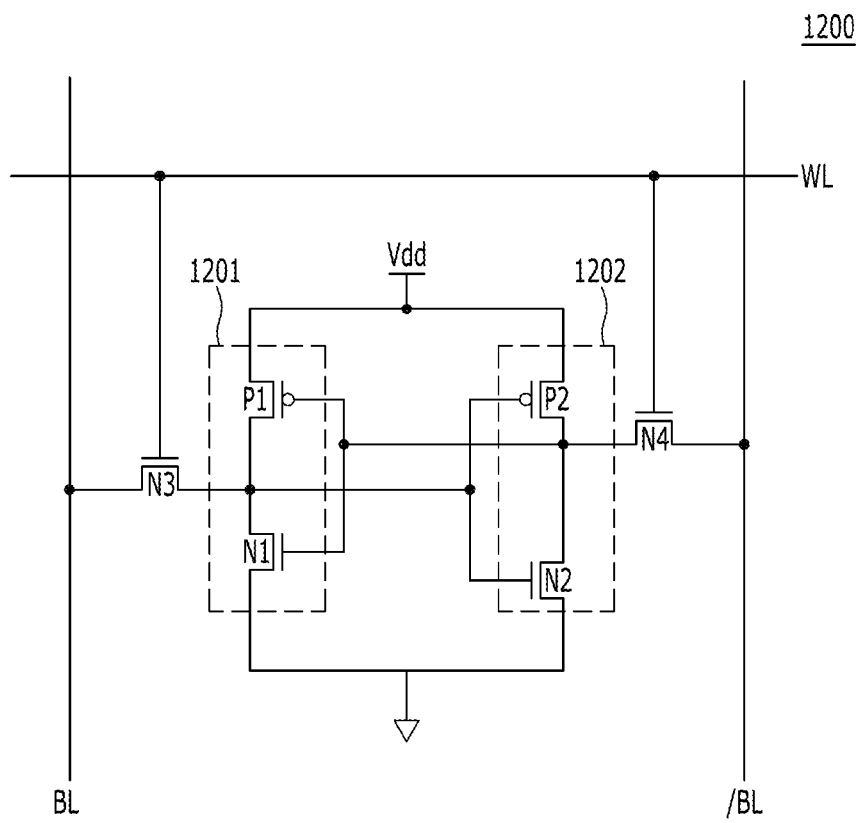
FIG. 14 is a circuit diagram showing a memory cell according to an embodiment.

FIG. 14 is a circuit diagram showing a memory cell according to an embodiment. FIG. 14 shows an SRAM cell 1200.

Referring to FIG. 14, the SRAM cell 1200 includes a plurality of transistors. In an embodiment, the SRAM cell 1200 includes PMOSFETs P1 and P2 of which sources are coupled to a power supply terminal Vdd and NMOSFETs N1 and N2 of which sources are grounded. Drains of the PMOSFET P1 and the NMOSFET N1 are coupled with each other, and drains of the PMOSFET P2 and the NMOSFET N2 are coupled with each other. That is to say, two CMOSFETs 1201 and 1202 are included in the SRAM cell 1200. Moreover, an NMOSFET N3 of which gate is coupled to a word line WL is coupled to and disposed between an output node of the CMOSFET 1201 and a bit line BL. An NMOSFET N4 of which gate is coupled to the word line WL is coupled to and disposed between an output node of the CMOSFET 1202 and a bit line bar/BL. In this way, the CMOSFETs 1201 and 1202 and the NMOSFETs N3 and N4 are employed in the SRAM cell 1200.

In FIG. 14, the NMOSFETs N3 and N4 and the CMOSFETs 1201 and 1202 include stressed channel transistors according to the embodiments. Each of the CMOSFETs 1201 and 1202 includes a stressed N channel, a stressed P channel, a first strained gate electrode formed on the stressed N channel, and a second strained gate electrode formed on the stressed P channel. The first strained gate electrode and the second strained gate electrode include lattice-mismatched silicon layers which induce strain to respectively apply different types of stress to the stressed N channel and the stressed P channel. Each of the NMOSFETs N3 and N4 includes a stressed N channel and a strained gate electrode including a lattice-mismatched silicon layer, and a tensile stress is applied to the stressed N channel by the strained gate electrode.

As a result, the SRAM cell 1200 may operate at a high speed.

Figure 15:
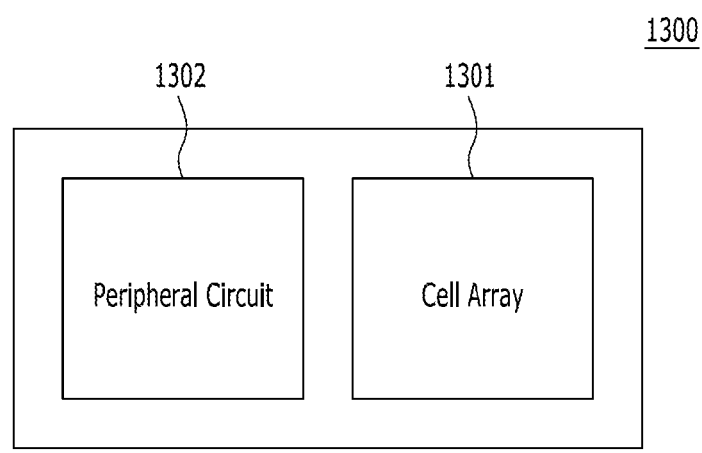
FIG. 15 is a diagram showing a memory device according to an embodiment.

FIG. 15 is a diagram showing a memory device 1300 according to an embodiment.

Referring to FIG. 15, the memory device 1300 includes a memory cell array 1301 and a peripheral circuit 1302. The memory cell array 1301 may include SRAM cells shown in FIG. 14, which include stressed channel transistors. In another embodiment, if the memory cell array 1301 includes DRAM, PRAM, FeRAM or flash memory cells, stressed channel transistors according to an embodiment may be applied to the peripheral circuit 1302. The peripheral circuit 1302 includes a decoder, a sense amplifier, an I/O circuit, and so forth. Each of the stressed channel transistors included in the peripheral circuit 1302 includes a stressed channel and a strained gate electrode including a lattice-mismatched silicon layer, and a stress is applied to the stressed channel by the strained gate electrode.

The memory device 1300 including a plurality of stressed channel transistors may operate at a high speed by stressed channel and thus achieve improved performance even if it is scaled down.

Although various embodiments have been described for illustrative purposes, it will be apparent to those skilled in the art that various changes and modifications may be made without departing from the spirit and scope of the invention as defined in the following claims.

What is claimed is:

1. A method for fabricating a semiconductor device, the method comprising:
preparing a substrate which includes a first transistor region and a second transistor region;
forming a first strained gate electrode which includes a first lattice-mismatched crystalline silicon layer disposed over the first transistor region; and
forming a second strained gate electrode which includes a second lattice-mismatched crystalline silicon layer disposed over the second transistor region,
wherein the forming of the first lattice-mismatched crystalline silicon layer comprises:
forming an arsenic-doped crystalline silicon layer by doping only arsenic; and
forming an undoped crystalline silicon layer disposed over the arsenic-doped crystalline silicon layer, the undoped crystalline silicon layer being undoped with arsenic, and
wherein the forming of the second lattice-mismatched crystalline silicon layer comprises:
forming a boron-doped crystalline silicon layer; and
forming a germanium-doped crystalline silicon layer, the germanium-doped crystalline silicon layer being disposed over the boron-doped crystalline silicon layer.

2. The method according to claim 1, wherein the forming of the arsenic-doped crystalline silicon layer and the undoped crystalline silicon layer comprises:
forming a gate dielectric layer over the substrate;
forming an amorphous silicon layer over the gate dielectric layer;
doping arsenic into a lower portion of the amorphous silicon layer to form a stacked structure of a doped amorphous silicon layer and an undoped amorphous silicon layer; and
performing an annealing process on the stacked structure to convert the doped amorphous silicon layer and the undoped amorphous silicon layer into the arsenic-doped crystalline silicon layer and the undoped crystalline silicon layer, respectively, which are included in the first lattice-mismatched crystalline silicon layer.

3. The method according to claim 1, wherein the forming of the boron-doped crystalline silicon layer and the germanium-doped crystalline silicon layer comprises:
forming a gate dielectric layer over the substrate;
forming an amorphous silicon layer over the gate dielectric layer;
doping boron into a lower portion of the amorphous silicon layer to form a first doped amorphous silicon layer;
doping germanium into a upper portion of the amorphous silicon layer to form a second doped amorphous silicon layer over the first doped amorphous silicon layer; and
performing an annealing process on the first and second amorphous silicon layers to convert the first doped amorphous silicon layer and the second doped amorphous silicon layer into the boron-doped crystalline silicon layer and the germanium-doped crystalline silicon layer, respectively, which are included in the second lattice-mismatched crystalline silicon layer.

4. The method according to claim 1, wherein the forming of the arsenic-doped crystalline silicon layer and the undoped crystalline silicon layer and the forming of the boron-doped crystalline silicon layer and the germanium-doped crystalline silicon layer comprise:
forming an amorphous silicon layer over the substrate;
masking the second transistor region;
doping arsenic into a lower portion of the amorphous silicon layer formed over the first transistor region to form a first stacked structure of a first doped amorphous silicon layer doped with arsenic and an amorphous silicon layer that is not doped with arsenic;
masking the first transistor region;
sequentially doping boron and germanium into a lower portion and an upper portion of the amorphous silicon layer formed over the second transistor region, respectively, to form a second stacked structure of a second doped amorphous silicon layer doped with boron and a third doped amorphous silicon layer doped with germanium;
patterning the first stacked structure and the second stacked structure to form a first gate electrode and a second gate electrode, respectively; and
converting the first gate electrode and the second gate electrode into the first lattice-mismatched crystalline silicon layer, which includes the arsenic-doped crystalline silicon layer and the undoped crystalline silicon layer, and the second lattice-mismatched crystalline silicon layer, which includes the boron-doped crystalline silicon layer and the germanium-doped crystalline silicon layer, respectively.

5. The method according to claim 4, after forming the first gate electrode and the second gate electrode, further comprising:
implanting impurities into the substrate to form source regions and drain regions; and
performing an activation annealing process on a resultant structure including the source regions and the drain regions,
wherein the first gate electrode and the second gate electrode are converted into the first lattice-mismatched crystalline silicon layer and the second lattice-mismatched crystalline silicon layer, respectively, by the activation annealing process.

6. The method according to claim 1, after forming the first strained gate electrode and the second strained gate electrode, further comprising:
forming a metal silicide layer over the first lattice-mismatched crystalline silicon layer and the second lattice-mismatched crystalline silicon layer.

7. The method according to claim 1, wherein the first transistor region comprises a first channel, the first channel being converted into a tensile stressed channel by a tensile stress applied from the first strained gate electrode, and the second transistor region comprises a second channel, the second channel being converted into a compressive stressed channel by a compressive stress applied from the second strained gate electrode.

* * * * *